(12) United States Patent
Farquhar

(10) Patent No.: US 9,585,271 B2
(45) Date of Patent: Feb. 28, 2017

(54) SOLID-STATE DRIVE HOUSING, A SOLID-STATE DISK USING THE SAME AND AN ASSEMBLING PROCESS THEREOF

(71) Applicant: James Farquhar, Penang (MY)

(72) Inventor: James Farquhar, Penang (MY)

(73) Assignee: FOURTE INTERNATIONAL, LTD., Penang (MY)

( * ) Notice: Subject to any disclaimer, the term of this patent is extended or adjusted under 35 U.S.C. 154(b) by 125 days.

(21) Appl. No.: 14/688,791

(22) Filed: Apr. 16, 2015

(65) Prior Publication Data

US 2015/0223360 A1    Aug. 6, 2015

Related U.S. Application Data

(62) Division of application No. 13/712,739, filed on Dec. 12, 2012.

(51) Int. Cl.
    *H05K 5/02*    (2006.01)
(52) U.S. Cl.
    CPC ......... *H05K 5/0256* (2013.01); *H05K 5/0208* (2013.01); *Y10T 29/49021* (2015.01); *Y10T 29/49826* (2015.01)
(58) Field of Classification Search
    CPC ................ H05K 5/0256; H05K 5/0208; Y10T 29/49021
    USPC ....................................................... 361/752
    See application file for complete search history.

(56) References Cited

U.S. PATENT DOCUMENTS

| 6,128,194 | A  | * | 10/2000 | Francis | H05K 5/0269 235/492 |
| 6,269,537 | B1 | * | 8/2001 | Kimura | H05K 5/0269 164/900 |
| 6,628,524 | B1 | * | 9/2003 | Washino | G06K 19/07743 361/736 |
| 6,775,132 | B2 | * | 8/2004 | Chen | G06F 1/184 312/223.1 |
| 7,109,976 | B2 | * | 9/2006 | Cobian | G06F 3/0414 345/173 |
| 8,149,583 | B2 | * | 4/2012 | Ishii | H05K 3/368 361/679.31 |
| 2010/0265675 | A1 | * | 10/2010 | Aoki | H05K 5/0269 361/752 |
| 2011/0019356 | A1 | * | 1/2011 | Moriai | G06F 1/20 361/679.32 |

(Continued)

*Primary Examiner* — David M Sinclair
*Assistant Examiner* — Robert Brown
(74) *Attorney, Agent, or Firm* — Foster Pepper PLLC

(57) ABSTRACT

This invention relates to a solid-state drive housing, a solid-state disk using the same and an assembling process thereof. The present invention is capable of preventing the unauthorized disassembly of the consumer. The solid-state drive housing comprising a upper cover and a basement, where the lower casing has a plurality of first hollows, the upper cover has a second base and a plurality of fastening structures one pieced formed therewith, part of the end of the fastening structures are bent and disposed in the corresponding first hollows so as to secure the second member with the first member. By the novelty assembling process provided by the present invention, the user may secures the upper cover and the lower casing without the screw liked fasteners and completes the assembly in only a few quick steps, meanwhile, the present invention is also capable of preventing the unauthorized disassembly of the consumer.

6 Claims, 5 Drawing Sheets

(56) References Cited

U.S. PATENT DOCUMENTS

2014/0160698 A1* 6/2014 Farquhar ............. H05K 5/0208
361/752

* cited by examiner

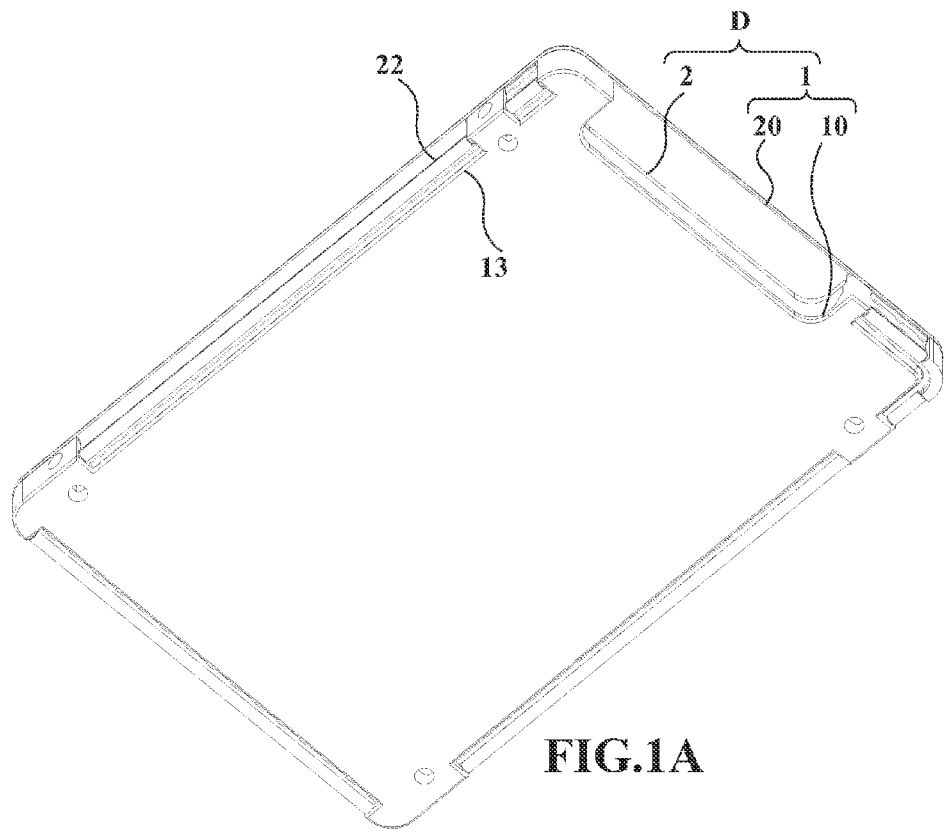
FIG.1A
FIG.1B
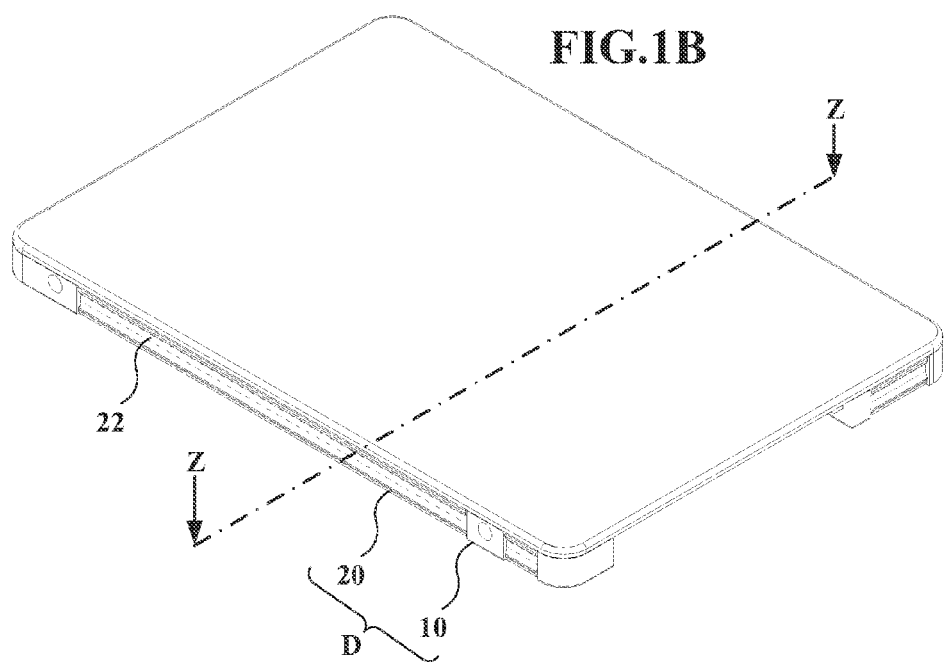

SOLID-STATE DRIVE HOUSING, A SOLID-STATE DISK USING THE SAME AND AN ASSEMBLING PROCESS THEREOF

PRIORITY CLAIM

This is a Divisional application of U.S. application Ser. No. 13/712,739 entitled "A SOLID-STATE DRIVE HOUSING, A SOLID-STATE DISK USING THE SAME AND AN ASSEMBLING PROCESS THEREOF," filed Dec. 12, 2012, which is incorporated herein by reference

FIELD OF THE INVENTION

This invention relates to a solid-state drive housing, a solid-state disk using the same and an assembling process thereof. More particularly, the present invention related to a solid-state drive housing assembling process which is capable of preventing the disassembly of the solid-state drive housing by the consumer.

BACKGROUND

A solid-state drive (SSD) is a data storage device that uses integrated circuit assemblies as memory to store data persistently. SSD technology uses electronic interfaces compatible with traditional block input/output (I/O) hard disk drives. SSDs do not employ any moving mechanical components, which distinguishes them from traditional magnetic disks such as hard disk drives (HDDs) or floppy disks, which are electromechanical devices containing spinning disks and movable read/write heads. Compared with electromechanical disks, SSDs are typically less susceptible to physical shock, are silent, and have lower access time and latency, however, the high manufacturing cost thereof prevents the widespread of the SSD.

Usually, the SSD is mainly composed of three main components, such as housing, PCB having chips sealed thereon and the connecting port. Please refer to the U.S. Pat. No. 8,213,182 (hereinafter called as '182), it discloses a housing case having an electronic circuit board, which includes: a lower case portion which internally houses a circuit board for mounting electronic components; and an upper case portion which is externally fitted to the lower case portion to form a box-like member. More specifically, the '182 discloses a screw free SSD housing that can be easily assembled and disassembled.

However, apart from the screw free SSD housing design, a need exists that some of the manufacturer may wants to prevent the consumer to disassemble the housing without the authorization thereof. Accordingly, a need of a low cost, simple design hosing capable of prevent the unauthorized disassembly of the consumer exists.

SUMMARY OF THE INVENTION

One object of the present invention is to provide a solid-state drive housing and an assembling process thereof so as to solve the problem of the prior art. According to an embodiment of the invention, the solid-state drive housing of the present invention is capable of preventing the consumer to disassemble the housing without the authorization of the manufacturer. The solid-state drive housing comprises a first member and a second member. The first member has a plurality of first hollows formed on the surface thereof and the second member, having a second base and a plurality of fastening structures one pieced formed therewith, part of the end of the fastening structures are plastically bent and disposed in the corresponding first hollows so as to secure the second member therewith.

While in practice, the fastening structures may, or may not, be hook shaped. Furthermore, the first member may further has a first base and a sidewall, the first base having a first inner base surface and a corresponding first outer base surface having the plurality of first hollows formed thereon, the sidewall extending outward from the first inner base surface so as to surround and form an spacing therein.

Furthermore, the sidewall has an inner sidewall surface and a corresponding outer sidewall surface, the fastening structures of the second member extends outward from the second inner base surface toward the first base along the outer sidewall surface. Furthermore, the fastening structures may have a body portion and an end portion, each of the end portions of the fastening structures disposes in the corresponding first hollows and connects with the second base via the body portion. Moreover, the outer sidewall surface may has a plurality of second hollows formed thereon and part of the body portion of the fastening structures is plastically bent and disposed therein. Furthermore, the bottom surface of the second hollow has a groove liked structure extending along the outer sidewall surface.

Moreover, the extending direction of the body portion is approximately inverse or horizontal to the extending direction of the top end of the end portion after the assembly. Furthermore, the second member may further has at least one interval formed between the plurality of fastening structures so as to expose part of the sidewall therethrough.

Another object of the present invention is to provide a novel solid-state drive having a PCB fasten in the SSD housing previously described so as to solve the problem in the prior art.

Moreover, another object of the present invention is to provide a novel solid-state drive assembling process for solving the problem in the prior art. The process comprises the steps of preparing a first member, preparing a second member, and securing the said members. It should be noticed that, since the specific design of the first member and second member are described as previously shown, therefore, the detail description thereof shall be herein omitted.

Then, after the preparation of the first member and the second member, the assembler may connects the sidewall of the first member with the second inner base surface of the second member so as to cover the spacing. Then, the user may presses and plastically deforms the top end of the end portion of the fastening structure into the corresponding hollow portion, meanwhile, the extending direction of the body portion may be approximately inverse to the extending direction of the top end of the end portion so as to secure the first member with the second member so as to secure the second member with the first member.

Furthermore, in the actual practice, the inner sidewall surface of the first member may optionally has a plurality of second hollows formed thereon, so as to allowing the body portion of the fastening structures to be plastically deformed and be accommodated therein. It worth a mention that, an adhesive layer is disposed on the contact area between the first member and the second member, the adhesive layer is formed on the surface of the second member. Moreover, part of the end of the fastening structures and the corresponding surface of the first hollows are both plastically deformed and the amount of deformation are approximately the same.

By the said design, the consumer shall not able to disassemble the SSD easily without damaging the housing solving the long lasted problem exists in the art. On the advantages and the spirit of the invention, it can be understood further by the following invention descriptions and attached drawings.

BRIEF DESCRIPTION OF THE DRAWINGS

FIGS. 1A and 1B illustrates the assembled solid-state drive according to an embodiment of the present invention in various viewing angles.

DETAILED DESCRIPTION

Figure 2A:
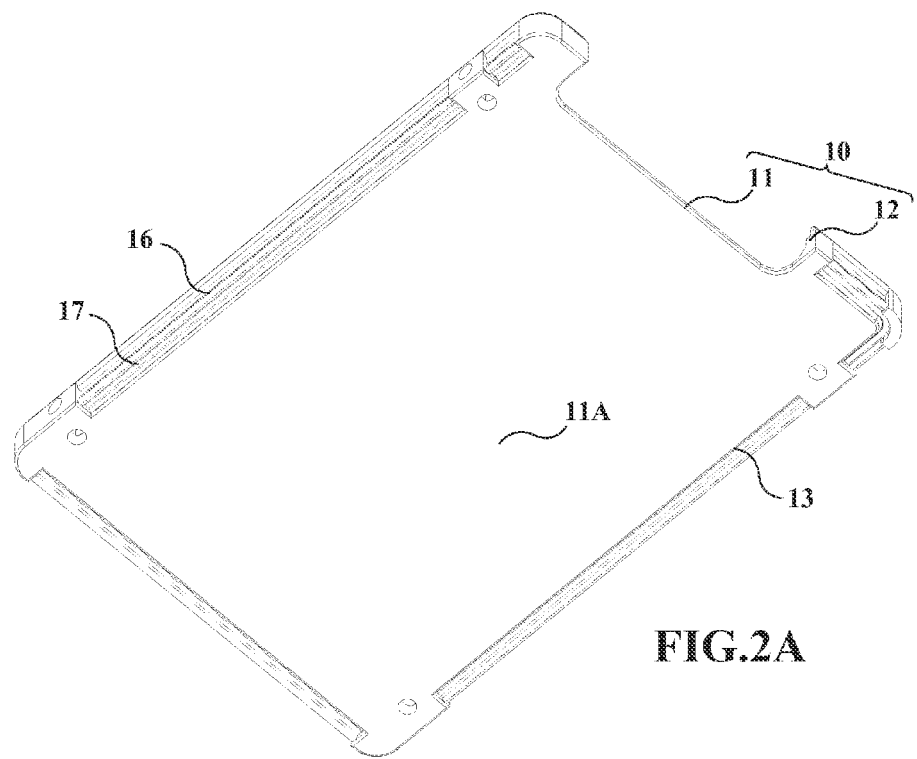
FIG. 2A and FIG. 2B are schematic drawings illustrating the first member of the embodiment of FIG. 1A in various viewing angles.

The present invention discloses a solid-state drive housing (hereinafter called as the housing), a solid-state disk (hereinafter called as SSD) using the same and an assembling process thereof.

Please refer to FIG. 1A and FIG. 1B. FIGS. 1A and 1B illustrates the assembled solid-state drive 1 according to an embodiment of the present invention in various viewing angles. As shown in FIG. 1A and FIG. 1B, the solid-state drive D (hereinafter called as SSD) of the present invention mainly includes a SSD housing 1 with a printed circuit board 2 (hereinafter called as PCB) secured therein. The PCB 2 may, but not limited to, be a circuit board having a plurality of NAND chips sealed thereon. Moreover, the SSD housing 1 is essentially composed of, but not limited to, a first member 10 and a second member 20.

As shown in the FIG. 1A and FIG. 1B, the first member 10 is, but not limited to, the lower casing of the SSD housing 1 and has a plurality of first hollows 13 formed thereon. The second member 20 is, but not limited to, the upper cover of the SSD housing and has a plurality of fastening structures 22. By simply pressing the edge material of the second member 20, the edge material thereof shall be plastically deformed into the first hollows 13 of the first member 10 so as to secure the first member 10 with the second member 20 with no screw liked fasteners required. It should be noticed that, the edge material of the second member 20 may be optionally dug into the surface of the first member 10 for better fixity.

Figure 2B:
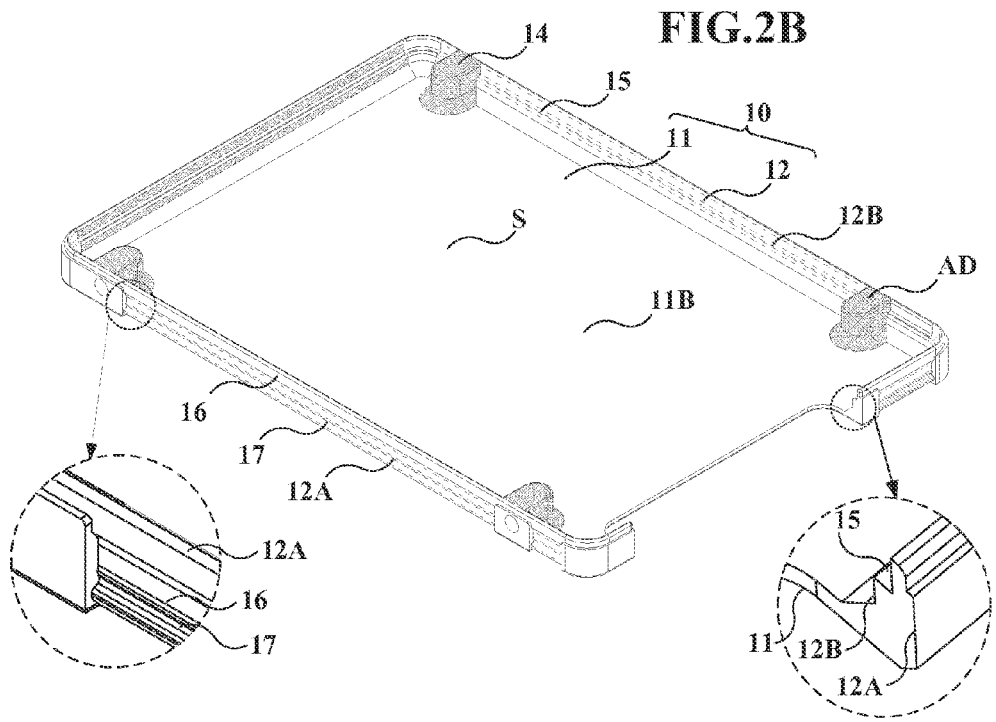

The details of the assembling process of the SSD housing 1 shall be herein described. First, a first member 10 and a second member 20 have to be prepared. Please refer to FIG. 2A and FIG. 2B, FIG. 2A and FIG. 2B are schematic drawings illustrating the first member of the embodiment of FIG. 1A in various viewing angles. By the FIG. 2A and FIG. 2B, it is clearly shown that the first member 10 has a first base 11 and a sidewall 12. The first base 11 has a first inner base surface 11B and a corresponding first outer base surface 11A with a plurality of first hollows 13 formed thereon. In this embodiment, the first hollows 13 may, or may not, extends along the edge of the first base 11 and be groove shaped. Moreover, the first hollows 13 are not penetrated through the second member 20 so as to maintain the tightness thereof. Furthermore, the width WD of the first hollows 13 are larger than the depth DP thereof so as to allow the end of the end portion 222 of the fastening structure 22 to be pressed and plastically deformed therein.

The sidewall 12 has an outer sidewall surface 12A and a corresponding inner sidewall surface 12B, the sidewall 12 extends outward vertically from the first inner base surface 11B and forms along the circumference of the first base 11 so as to surround and define a spacing S therein, allowing the PCB 3 or other essential electronic member to be disposed therein. Furthermore, apart from the first hollows 13, the first member may, or may not, further has a second hollows 16 formed on the outer sidewall surface 12A as shown in the figures.

Furthermore, the first member 10 may further has a platform 15 formed on the inner sidewall surface 12B, horizontally extended inwardly from the inner sidewall surface 12B, for supporting the PCB 2 thereon. It should be noticed that the sum of the height of the platform 15 and the thickness of the PCB 2 is preferred to smaller than the total height of the sidewall 12 in order to spare a reasonable size of space for the PCB 2. Moreover, the sidewall 12 may further has a plurality of tenon 14 formed on the inner sidewall surface 12B. The tenons 14 horizontally extend inwardly from the inner sidewall surface 12B and have approximately the same height as the sidewall 12. The plurality of tenons 14 may be utilized to position the PCB 2 by the mortises of the PCB 2. Furthermore, in order to secure the PCB 2 with the first member 10, a plurality of thin layers of dielectric adhesive material (grey colored) may be disposed among the interface of the first member 10 and the PCB 2. In the present embodiment, the first member 10 may, but not limited to, be formed of a metal or polymer material by die casting process and the first base thereof may only has an average thickness of 0.035 inches. More specifically, the first member depicts in the FIG. 2A and FIG. 2B has the length, width and the height of approximately 2.75 inches, 3.95 inches and 0.22 inches.

Figure 3A:
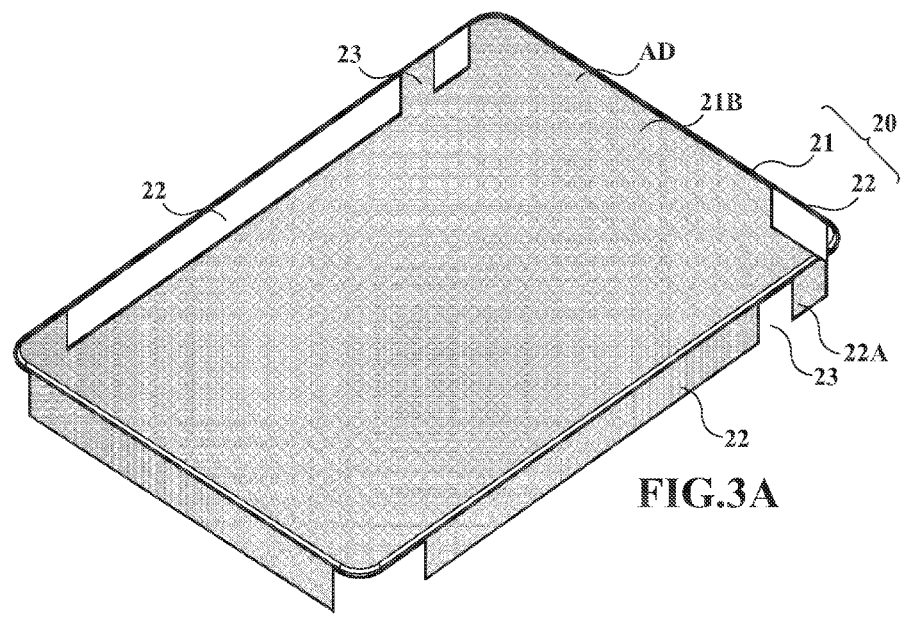
FIG. 3A and FIG. 3B are schematic drawings illustrating the second member of the embodiment of FIG. 1A in various viewing angles.
Figure 3B:
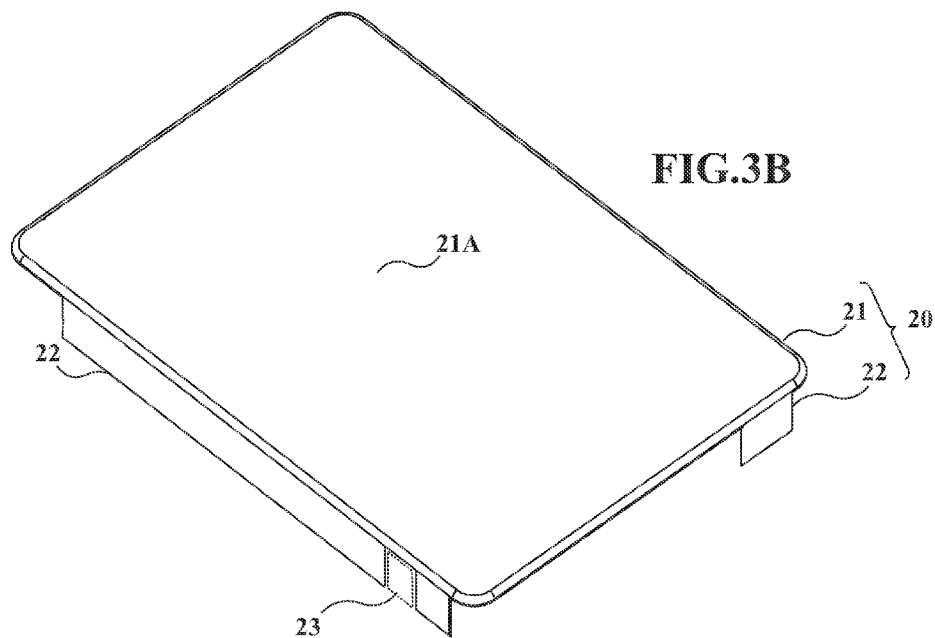

Please refer to FIG. 3A and FIG. 3B, FIG. 3A and FIG. 3B are schematic drawings illustrating the second member of the embodiment of FIG. 1A in various viewing angles. By the FIG. 3A and FIG. 3B, it is clearly shown that the second member 20 has a second base 21 and a plurality of fastening structures 22 extended therefrom. The second base 21 has a second outer base surface 21A and a corresponding second inner base surface 21B. Each of the plurality of fastening structures 22 has a corresponding inner surface 22A and outer surface 22B respectively. The plurality of fastening structures 22 extend outward vertically from the second inner base surface 21B which the fastening structure 22 may, but not limited to, be one piece formed with the second base 21. More specifically, a flat state second member 20 may firstly be formed by blanking process from a plate shaped material. Then, the fastening structures 22 may be folded so as to form the second base 21 and fastening structure 22 as depicted in FIG. 3A. More specifically, the second member 20 is preferred to be formed of a metal or polymer material.

Moreover, in actual practice, the entire, or at least part of the, internal surface of the second member 20 may optionally has an adhesive AD applied thereon for subsequent use. More specifically, in the embodiment, the entire internal surface of the second member 20, including the inner surface 22A of the fastening structures 22 and the second inner base surface 21B, may has an adhesive AD applied thereon before the initial folding process.

More specifically, in the embodiment, each of the fastening structure 22 may comprises a body portion 221 and end portion 222, the end portion 222 is formed on the top end of the fastening structures 22 and be connected to the second inner base surface 21B via the body portion 221. Before the assembly, the extending direction of the body portion 221 is approximately the same as the extending direction of the top end of the end portion 222. However, after the assembly, the extending direction of the body portion 221 may either vertical or inverse to the extending direction of the top end of the end portion 222 so as to secure the first member 10 with the second member 20. Moreover, at least one interval 23 is formed between the plurality of fastening structures 22 so as to allow the internal contents to be exposed therethrough. In the present embodiment depicted in the FIG. 3A and FIG. 3B, the second base of the second member 20 may only has an average thickness of 0.01 inches and the length and the width is approximately 2.75 inches and 4 inches.

Figure 4A:
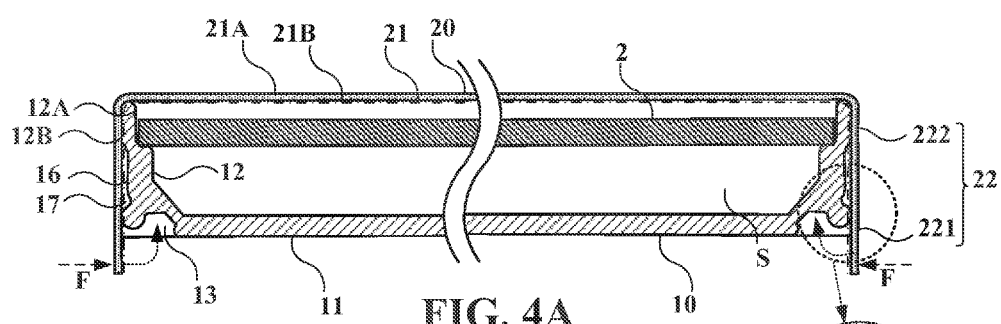
FIG. 4A and FIG. 4B are the cross-section diagrams along the Z-Z of FIG. 1 before and after the fastening structures are plastically bent.
Figure 4B:
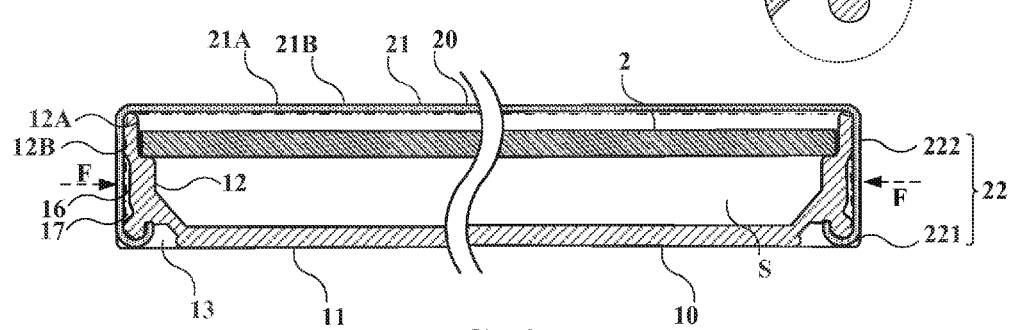

Please refer to FIG. 4A, FIG. 4B and FIG. 4C, FIG. 4A, FIG. 4B and FIG. 4C depicts the assembling process of the present invention. The FIG. 4A to 4C are corresponding to the cross-section diagrams along the Z-Z of FIG. 1. Once the first member 10, the second member 20 and the PCB 2 are ready, then the assembler may begin the assembling process by disposing the PCB 2 onto the platform 15 and matching the tenon 14 of the PCB with the mortise 31 of the PCB. Then, the assembler may connects the sidewall 12 of the first member 10 with the second inner base surface 21B so as to cover the spacing S thereby. Meanwhile, the body portion 221 of the fastening structures 22 covers part of the outer sidewall surface 12A, and at least part of the end portion 222 excess the first outer base surface 11A.

Then, the user may utilizes pressing tool, such as arbor press, or any other mechanical means to plastically deform the top end of the end portion 222 and force the top end thereof to be disposed into the corresponding first hollow 13 as shown in the FIG. 4B. It should be noticed that the top end of the end portion 222 is preferred, but not essentially, to be stamped, dug or embedded into the surface of the first hollow 13 by mechanically deforming the surface of the first hollow 13 with huge amount of force applied via the fastening structure 22. More specifically, the top end of the fastening structures are dug into the surface of the corresponding first hollows with approximately no interval formed between the embedded portion of fastening structures and the surface of the first hollow 13. Furthermore, the said crimpling process may be done by repeatedly applying various forces from various angles thereto so to as to create teeth like effect from the second member 20 to create grips so as to fix the first member 10 with the second member 20. Therefore, the amount of deformation of each of the surface of the first hollow 13 and the top end of the end portion 222 is approximately the same.

After the pressing process, the end portion 222 of the fastening structure 22 buckles with the first base 11 so as to secure the first member 10 with the second member 20 mutually. In the embodiment, the fastening structure 22 is now an U shaped hook liked structure. More specifically, while the first member 10 and the second member 20 are mutually secured, the extending direction of the body portion 221 may approximately inverse to the extending direction of the top end of the end portion 222. However, the shape thereof is not limited to a U shaped hook, the end portions 222 of the fastening structures 22 may also be V shaped, L shaped, C shaped or any other shape that are capable of fixing the relatively positions of the first member 10 and the second member 20.

Figure 5:
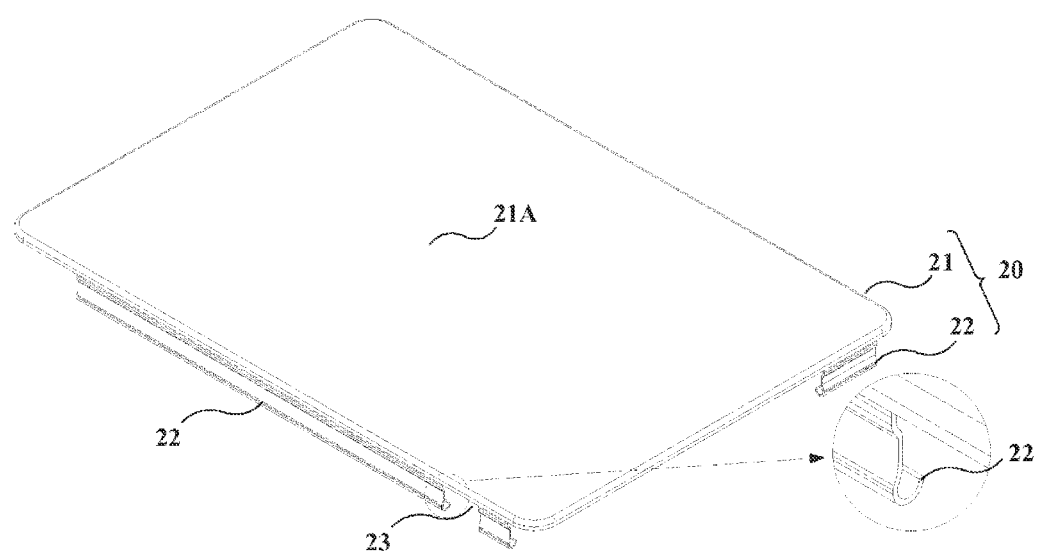
FIG. 5 illustrates the schematic figure of the second member after the said second crimping process according to an embodiment of the present invention.

Then, the assembler may, but not essentially, crimping the body portion 221 of the fastening structure 22 and plastically deforming the body portion 221 into the second hollows 16 by roll crimp process so as to provide more fixing capability. Meanwhile, the first member 10 or second member 20 may be heated so as to activate the dielectric adhesive material to provide further stability. Meanwhile, please refer to the FIG. 5, FIG. 5 illustrates the schematic figure of the second member after the said second crimping process.

As described above, the SSD housing can easily be assembled by simply pressing and plastically deforming the fastening structure of the second member 20 into the first hollow 13 so as to fix the relative position therebetween. By the said process, the screw liked fasteners and the screwing process thereof can be omitted and the unauthorized disassembly of the consumer can also be prevented since the disassembly thereof shall lead to the destruction of the housing 1. However, in the product maintaining process or malfunction eliminating process, the disassembly of the SSD housing can still be completed by pulling the end portion 222 of the fastening structure 22 toward the V cut portion 17 (or called as groove liked structure), the groove liked structure 17 extending along the outer sidewall surface as depicted as the enlarged figure shown in the FIG. 2B. Meanwhile, the second member is destroyed but PCB is safe. Accordingly, only the manufacturer itself may process the disassembly process since the consumer has no relative machine or raw member to replace the broken member previously described.

Compared to the prior art, the solid-state drive housing, the solid-state disk using the same and the assembling process thereof in the present invention is provided with fewer components and easy assembly, so as to reduce the assembly cost of the solid-state drive significantly. Furthermore, the present invention may also capable of preventing the unauthorized disassembly of the consumer.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Furthermore, it should be noticed that the members depicted in the figures are approximately proportionate to the real scale of the objective products, therefore the scale or the relative position of the components depicted therein should be considered as part of the contents of present specification.

It will be understood that when an element is referred to as being "connect" or "on" another element, it can be directly on the other element or intervening elements may be present therebetween. In contrast, when an element is referred to as being "contact" or "directly on" another element, there are no intervening elements present.

It will be understood that, although the terms "first," or "second," may be used herein to describe various elements or components, these elements or components should not be limited by these terms. These terms are only used to distinguish one element, component or region from another element or component. Thus, "a first member," or "component," discussed below could be termed a second element or component without departing from the teachings herein.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation illustrated in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

Finally, although the present invention has been illustrated and described with reference to the embodiment thereof, it should be understood that it is in no way limited to the details of such embodiment but is capable of numerous modifications within the scope of the appended claims.

The invention claimed is:

1. A solid-state drive assembling process, comprising:
preparing a first member, the first member having a first base and a sidewall, the first base having a first outer base surface and a corresponding first inner base surface, the first outer base surface having a plurality of first hollows formed thereon, the sidewall extending outward from the first inner base surface so as to surround and form a spacing therein;
preparing a second member, the second member having a second base and a fastening structure, the second base having a second inner base surface, the fastening structure one piece formed with the second base and extending outward therefrom, the fastening structure having a body portion and an end portion, the end portion connecting with the second base via the body portion, the extending direction of the body portion being approximately the same with the extending direction of the top end of the end portion;
connecting the sidewall of the first member with the second inner base surface; and
plastically deforming the top end of the end portion of the fastening structures into the corresponding first hollow causing the extending direction of the body portion being approximately inverse to the extending direction of the top end of the end portion so as to secure the first member with the second member.

2. The solid-state drive assembling process of claim 1, wherein the inner sidewall surface of the first member has a plurality of second hollows formed thereon.

3. The solid-state drive assembling process of claim 2, further comprising the step of:
plastically deforming the body portion of the fastening structures into the corresponding second hollows so as to secure the first member thereto.

4. The solid-state drive assembling process of claim 1, wherein an adhesive layer is disposed on the contact area between the first member and the second member, the adhesive is formed on the surface of the second member.

5. The solid-state drive assembling process of claim 4, further comprising the step of:
activating the adhesive by applying heat thereto.

6. The solid-state drive assembling process of claim 1, the top end of the fastening structures are dug into the surface of the corresponding first hollows with no interval formed therebetween.

* * * * *